(12) United States Patent
Lv et al.

(10) Patent No.: US 10,347,470 B2
(45) Date of Patent: Jul. 9, 2019

(54) PROCESS CHAMBER AND SEMICONDUCTOR PROCESSING APPARATUS

(71) Applicant: BEIJING NAURA MICROELECTRONICS EQUIPMENT CO., LTD., Beijing (CN)

(72) Inventors: Feng Lv, Beijing (CN); Fenggang Zhang, Beijing (CN); Mengxin Zhao, Beijing (CN); Peijun Ding, Beijing (CN)

(73) Assignee: BEIJING NAURA MICROELECTRONICS EQUIPMENT CO., LTD. (CN)

( * ) Notice: Subject to any disclaimer, the term of this patent is extended or adjusted under 35 U.S.C. 154(b) by 47 days.

(21) Appl. No.: 15/109,050

(22) PCT Filed: Dec. 29, 2014

(86) PCT No.: PCT/CN2014/095338
§ 371 (c)(1),
(2) Date: Jun. 29, 2016

(87) PCT Pub. No.: WO2015/096819
PCT Pub. Date: Jul. 2, 2015

(65) Prior Publication Data
US 2016/0322206 A1  Nov. 3, 2016

(30) Foreign Application Priority Data

Dec. 29, 2013  (CN) .......................... 2013 1 0737531
Aug. 28, 2014  (CN) .......................... 2014 1 0431336

(51) Int. Cl.
*H01J 37/32* (2006.01)
*H01L 21/67* (2006.01)
(Continued)

(52) U.S. Cl.
CPC .... *H01J 37/32642* (2013.01); *C23C 14/0068* (2013.01); *C23C 14/34* (2013.01);
(Continued)

(58) Field of Classification Search
CPC .......... H01J 37/32642; H01J 37/32449; H01J 37/32733; H01J 37/32853; H01J 37/34; H01J 37/3411; C23C 14/34; C23C 14/564
See application file for complete search history.

(56) References Cited

U.S. PATENT DOCUMENTS 5,108,569 A  *  4/1992  Gilboa ................ C23C 14/0063
                                                204/192.12
5,827,408 A  *  10/1998  Raaijmakers ......... C23C 14/046
                                                204/192.12
(Continued)

FOREIGN PATENT DOCUMENTS

CN        101065513 A     10/2007

OTHER PUBLICATIONS

PCT/CN2014/095338 International Search Report dated Mar. 27, 2015; 2 pgs.

*Primary Examiner* — John J Brayton
(74) *Attorney, Agent, or Firm* — Bracewell LLP; Brad Y. Chin

(57) ABSTRACT

Embodiments of the invention provide a process chamber and a semiconductor processing apparatus. According to at least one embodiment, the process chamber includes a reaction compartment, a gas introducing system and a wafer transfer device. The reaction compartment is provided in the process chamber and used for performing a process on a wafer, the gas introducing system is used for providing processing gas to the reaction compartment, and the wafer transfer device is used for transferring the wafer into the reaction compartment. A lining ring assembly is provided in the reaction compartment, and is configured such that a flow (Continued)

uniformizing cavity is formed between the lining ring assembly itself and an inner side wall of the reaction compartment, so as to uniformly transport the processing gas, from the gas introducing system, into the reaction compartment through the flow uniformizing cavity.

10 Claims, 4 Drawing Sheets

(51) Int. Cl.
 *C23C 14/00* (2006.01)
 *C23C 14/34* (2006.01)
 *C23C 14/56* (2006.01)
 *H01J 37/34* (2006.01)
(52) U.S. Cl.
 CPC ...... *C23C 14/564* (2013.01); *H01J 37/32449* (2013.01); *H01J 37/32633* (2013.01); *H01J 37/32733* (2013.01); *H01J 37/32853* (2013.01); *H01J 37/34* (2013.01); *H01J 37/3411* (2013.01); *H01L 21/6719* (2013.01); *H01L 21/67167* (2013.01); *H01L 21/67207* (2013.01)

(56) References Cited

U.S. PATENT DOCUMENTS

| | | | |
|---|---|---|---|
| 6,270,862 B1* | 8/2001 | McMillin | C23C 16/455 427/569 |
| 9,175,377 B2* | 11/2015 | Ishihara | C23C 14/0042 |
| 2004/0217217 A1 | 11/2004 | Han et al. | |
| 2011/0186426 A1 | 8/2011 | Hawrylchak et al. | |
| 2012/0090691 A1* | 4/2012 | Baluja | C23C 16/4405 137/13 |

* cited by examiner

PROCESS CHAMBER AND SEMICONDUCTOR PROCESSING APPARATUS

CROSS REFERENCE TO RELATED APPLICATION

This application claims the benefit of and priority to PCT/CN2014/095338 filed on Dec. 29, 2014, entitled (translation), "PROCESS CHAMBER AND SEMICONDUCTOR PROCESSING APPARATUS," which claims the benefit of and priority to Chinese Patent Application Nos. 201310737531.4 filed on Dec. 29, 2013, and 201410431336.3 filed on Aug. 28, 2014, both of which are entitled (translation), "PROCESS CHAMBER AND SEMICONDUCTOR PROCESSING APPARATUS," and both of which are hereby incorporated by reference in their entirety into this application.

BACKGROUND

Field of the Invention

Embodiments of the invention relate to the manufacturing field of a semiconductor apparatus, and more specifically relate to a process chamber and a semiconductor processing apparatus.

Description of the Related Art

A fundamental principle of physical vapor deposition (PVD) is that, under vacuum, a metal, or a metal alloy or a metal compound is evaporated and then deposited on a surface of a substrate, so as to form a thin film having a specific function. Common methods of PVD mainly include vacuum evaporation, plasma sputter coating, arc plasma coating, ion coating, molecular beam epitaxy, and the like. Here, the plasma sputter coating is a PVD technique which is the most representative and most widely used at present. When performing a deposition (film coating) process on a semiconductor wafer by using the plasma sputtering technique, a process chamber used is generally kept under vacuum, and processing gas is provided in the process chamber and is excited to generate plasma; then the plasma bombards a target material, so that sputtered target material is deposited on the surface of the wafer to form a thin film required for the process.

In terms of manufacture of a thin film of a semiconductor wafer, the uniformity of the thin film on the entire surface of the wafer is an essential process index, which is closely related to the distribution of an electromagnetic field, a thermal field, an airflow field and the like on and around the semiconductor wafer. Therefore, increasing the uniformity of distribution of the electromagnetic field, the thermal field and the airflow field is one of important ways to improve the uniformity of the process.

FIG. 1 is a cross-sectional side view of a conventional process chamber. FIG. 2 is an enlarged front view of an area I in FIG. 1. As illustrated in FIGS. 1 and 2, the conventional process chamber includes a cavity 106, a reaction chamber 118, an upper electrode chamber 111, a lifting mechanism, and an ejector pin mechanism. The reaction chamber 118 is positioned on top of the cavity 106 to perform a process on a wafer. The lifting mechanism includes a pedestal 110, a pedestal lifting shaft 108, and a pedestal driving source (not shown in the drawings). The pedestal 110 is used for bearing a wafer 112 and is connected to the pedestal driving source through the pedestal lifting shaft 108, and the pedestal driving source is used for driving the pedestal lifting shaft 108 to move vertically in a straight line, thus allowing the pedestal lifting shaft 108 to move up and down in a vertical direction, so that the pedestal 110 is driven to rise into the interior of the reaction chamber 118 or fall into the interior of the cavity 106. In addition, an opening penetrating through a top wall of the cavity 106 is provided at a position, corresponding to the reaction chamber 118, in an upper surface of the top wall, and the pedestal 110 can enter into the reaction chamber 118 through the opening.

Furthermore, a lining ring assembly is further provided in the reaction chamber 118, which includes a lower lining ring 116 and an upper lining ring 117 at an inner side of the lower lining ring 116, the lower and upper lining rings covering the entire surface of a side wall of the reaction chamber 118 to prevent the side wall from being attached with contaminant particles. In addition, a pressing ring 115 is further provided in the reaction chamber 118, for fixing, with the help of its own weight, the wafer 112 onto the pedestal 110 when the pedestal 110 is raised to a processing position inside the reaction chamber 118. A curved part, which is bent inwardly from the lower end of the lower lining ring 116 and extends to the bottom of the pressing ring 115, is provided at a lower end of the lower lining ring 116, and used for supporting the pressing ring 115 when the pedestal 110 moves out of the reaction chamber 118.

A wafer transfer channel 102 is provided in a side wall of the cavity 106 to provide a path for moving the wafer 112 into or out of the cavity 106. The ejector pin mechanism is provided in the cavity 106, and includes at least three ejector pins 105, an ejector pin lifting shaft 107 and an ejector pin driving source (not shown in the drawings). The at least three ejector pins 105 are connected to the ejector pin driving source through the ejector pin lifting shaft 107, the ejector pin driving source is used for driving the ejector pin lifting shaft 107 to move vertically in a straight line, so that the at least three ejector pins 105 are driven to rise or fall to assist a mechanical arm, which is used for transferring the wafer 112 into the cavity 106, to move the wafer 112 onto the pedestal 110 or to move the wafer 112 out of the cavity 106 from the pedestal 110.

The upper electrode chamber 111 is provided on top of the reaction chamber 118 with a ceramic ring 114, which is used for electrically insulate the upper electrode chamber 111 and the reaction chamber 118 from each other, interposed between the upper electrode chamber 111 and the reaction chamber 118. In addition, a target material 113 is provided on a lower surface of a bottom wall of the upper electrode chamber 111, and a magnetron 104, as well as a magnetron driving mechanism used for driving the magnetron 104 to rotate relatively to a surface of the target material 113, is provided in the upper electrode chamber 111. Further, a gas inlet 103 is provided under the wafer transfer channel 102 at the side wall of the cavity 106, and is used for transmitting the processing gas into the cavity 106. The processing gas flows in a direction as indicated by arrows in FIGS. 1 and 2, and diffuses from one side of the cavity 106 to another side thereof until it fills the whole cavity 106. During this process, a part of the processing gas flows into the reaction chamber 118 through a gap between the pressing ring 115 and the curved part of the lower lining ring 116 to be excited to generate plasma during the process.

The following problems inevitably exist in the practical application of the above process chamber:

First, since the processing gas gradually diffuses from one side of the cavity 106 to the interior of the reaction chamber 118, the processing gas diffuses to the processing space at a low speed, and also, inside the reaction chamber 118, a distribution density of the processing gas within a region close to the gas inlet is inevitably higher than that within a region away from the gas inlet, so the distribution of the processing gas is nonuniform inside the reaction chamber 118, thereby adversely affecting the uniformity of process, and Second, since not all the processing gas entering the cavity 106 can diffuse into the reaction chamber 118 and be involved in the processing, it is very hard to control a flow of the processing gas involved in the processing, thereby adversely affecting the processing results.

SUMMARY

Embodiments of the invention are intended to solve at least one of the technical problems existing in the prior art, and provide a process chamber and a semiconductor processing apparatus, which can improve a speed at which the processing gas flows into a reaction chamber, an accuracy of controlling a flow of the processing gas involved in the processing, and the uniformity of distribution of the processing gas within the reaction chamber.

According to at least one embodiment, there is provided a process chamber, which includes a reaction compartment, a gas introducing system, and a wafer transfer device, wherein the reaction compartment is provided in the process chamber and is used for performing a process on a wafer therein, the gas introducing system is used for providing processing gas into the reaction compartment, and the wafer transfer device is used for transferring the wafer into the reaction compartment. A lining ring assembly is provided in the reaction compartment, and is configured such that a flow uniformizing cavity is formed between the lining ring assembly itself and an inner side wall of the reaction compartment, so as to uniformly transport the processing gas, from the gas introducing system, into the reaction compartment through the flow uniformizing cavity.

According to at least one embodiment, the lining ring assembly includes an upper ring body and a lower ring body, the upper ring body is positioned at an inner side of the lower ring body with a ring-shaped gap interposed therebetween, and the ring-shaped gap is connected to the interior of the reaction compartment. An upper ring-shaped horizontal part is provided on an outer side wall of the upper ring body, a lower ring-shaped horizontal part is provided on an outer side wall of the lower ring body, a ring-shaped vertical part is provided between the upper ring-shaped horizontal part and the lower ring-shaped horizontal part, and the flow uniformizing cavity is formed by the upper ring-shaped horizontal part, the lower ring-shaped horizontal part, the ring-shaped vertical part and the inner side wall of the reaction compartment. In addition, a plurality of radial through holes are distributed uniformly in the ring-shaped vertical part, and are connected to the flow uniformizing cavity and the ring-shaped gap, respectively.

According to at least one embodiment, the process chamber includes one reaction compartment.

According to at least one embodiment, the process chamber includes at least two reaction compartments, which are distributed uniformly along a circumferential direction of the process chamber. Each reaction compartment forms an independent processing environment therein. The number of gas introducing systems corresponds to that of reaction compartments, and the gas introducing systems transport processing gases into the reaction compartments in one-to-one correspondence.

According to at least one embodiment, a gas inlet channel is formed in a side wall of the reaction compartment, and has a gas inlet connected to the gas introducing system, and a gas outlet provided at the inner side wall of the reaction compartment and connected to the flow uniformizing cavity.

According to at least one embodiment, the gas inlet of the gas inlet channel is positioned at top of the reaction compartment.

According to at least one embodiment, the radial through hole has a diameter ranging from 0.5 mm to 2 mm.

According to at least one embodiment, the upper ring body, the upper ring-shaped horizontal part and the ring-shaped vertical part are formed integrally, and the lower ring body and the lower ring-shaped horizontal part are formed integrally; or, the upper ring body and the upper ring-shaped horizontal part are formed integrally, and the lower ring body, the lower ring-shaped horizontal part and the ring-shaped vertical part are formed integrally.

According to another embodiment, there is provided a semiconductor processing apparatus, which includes a process chamber for performing a process on a wafer therein, a degas chamber for removing water vapor from the wafer, a precleaning chamber for removing residue on a surface of the wafer, and a transfer chamber connected to the process chamber, the degas chamber and the precleaning chamber, respectively. A mechanical arm is provided in the transfer chamber for transferring the wafer into different chambers. The process chamber may be a process chamber provided by any embodiment of the invention described in this disclosure.

According to at least one embodiment, the semiconductor processing apparatus includes a plurality of process chambers.

BRIEF DESCRIPTION OF THE DRAWINGS

These and other features, aspects, and advantages of the invention are better understood with regard to the following Detailed Description, appended Claims, and accompanying Figures. It is to be noted, however, that the Figures illustrate only various embodiments of the invention and are therefore not to be considered limiting of the invention's scope as it may include other effective embodiments as well.

DETAILED DESCRIPTION

Figure 1:
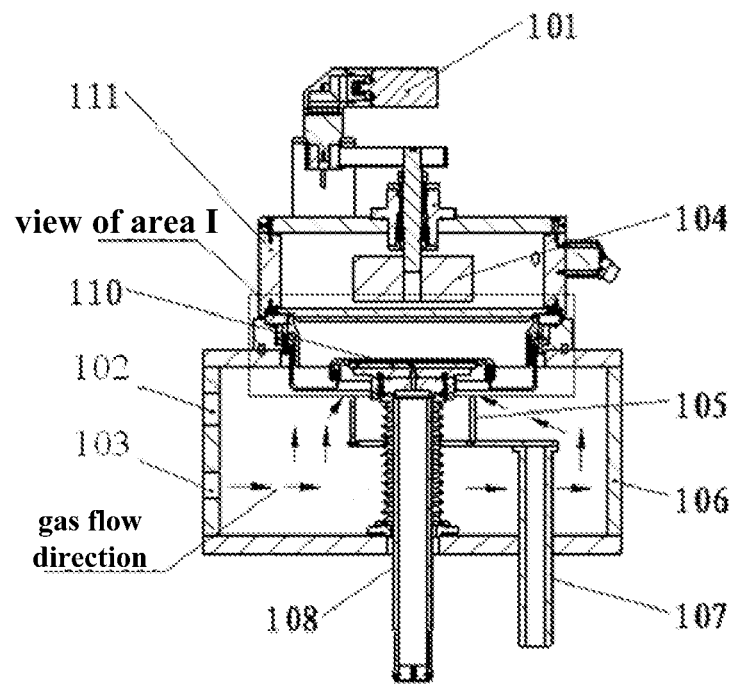
FIG. 1 is a cross-sectional side view of a conventional process chamber.
Figure 2:
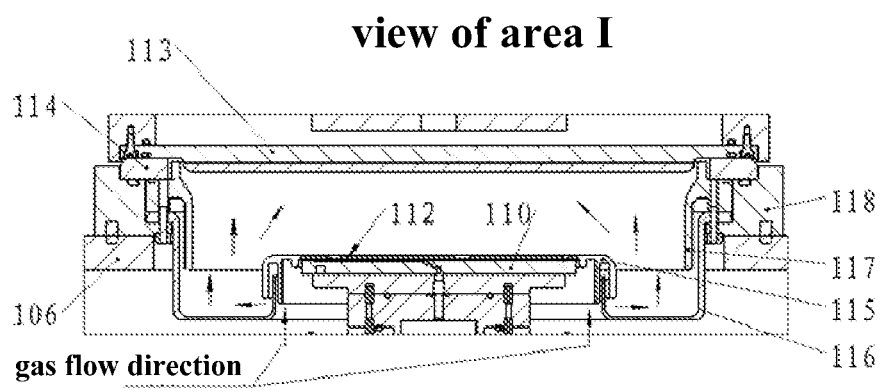
FIG. 2 is an enlarged front view of an area I in FIG. 1 of the conventional process chamber.

Advantages and features of the invention and methods of accomplishing the same will be apparent by referring to embodiments described below in detail in connection with the accompanying drawings. However, the invention is not limited to the embodiments disclosed below and may be implemented in various different forms. The embodiments are provided only for completing the disclosure of the invention and for fully representing the scope of the invention to those skilled in the art.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. According to at least one embodiment, the dimensions of some of the elements in the figures may be exaggerated relative to other elements to help improve understanding of embodiments of the invention. Like reference numerals refer to like elements throughout the specification.

To make those skilled in the art better understand the technical solutions of the present invention, a process chamber and a semiconductor processing apparatus provided by the present invention will be described in detail below in conjunction with the accompanying drawings.

Figure 3A:
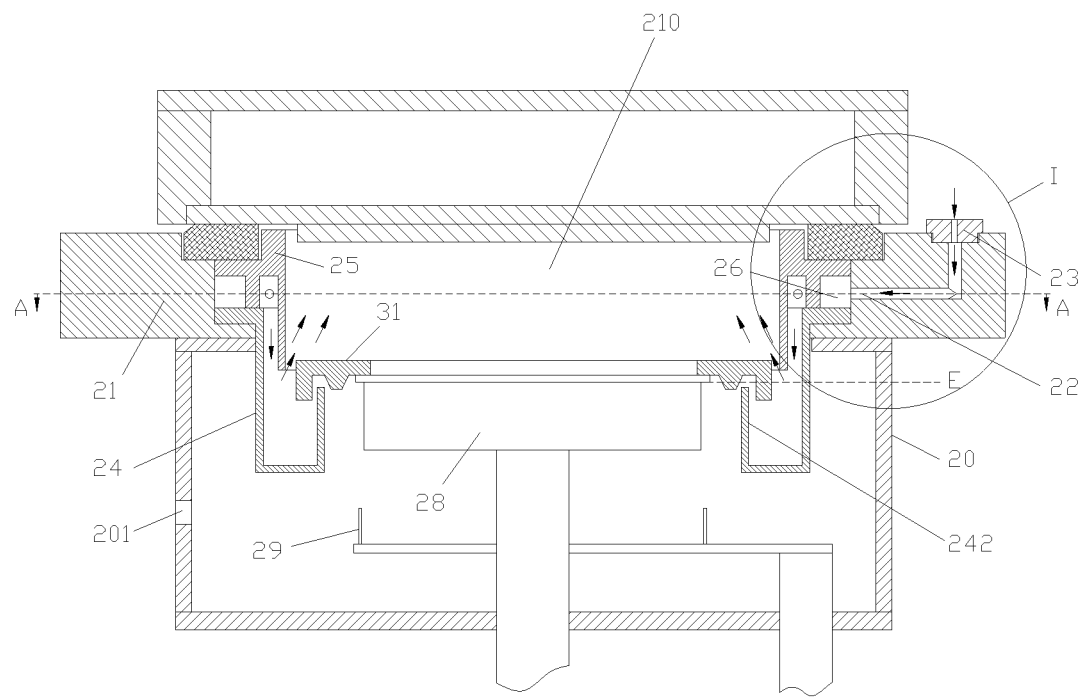
FIG. 3A is a cross-sectional view of a process chamber according to a first embodiment of the invention.

FIG. 3A is a cross-sectional view of a process chamber according to a first embodiment of the invention. Referring to FIG. 3A, the process chamber according to the first embodiment of the invention includes a reaction compartment 210, a gas introducing system, and a wafer transfer device. According to at least one embodiment, one reaction compartment 210 is provided in the process chamber and used for performing a process on the wafer therein. Specifically, the process chamber is formed by a chamber body 20, and a ring-shaped chamber body 21 is provided on top of the chamber body 20, the ring-shaped chamber body 21 constituting the reaction compartment 210. The gas introducing system (not shown in the figure) is used for providing processing gas to the reaction compartment 210.

Figure 3B:
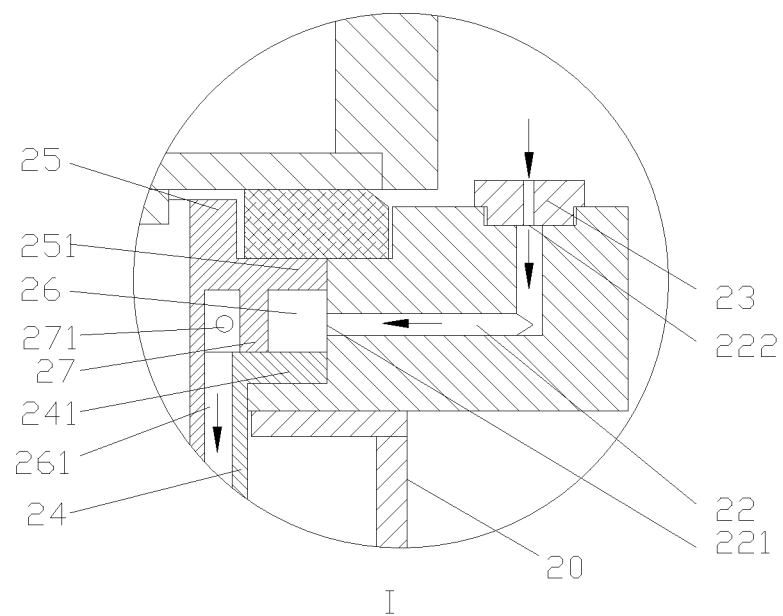
FIG. 3B is an enlarged view of an area I in FIG. 3A according to the first embodiment of the invention.
Figure 3C:
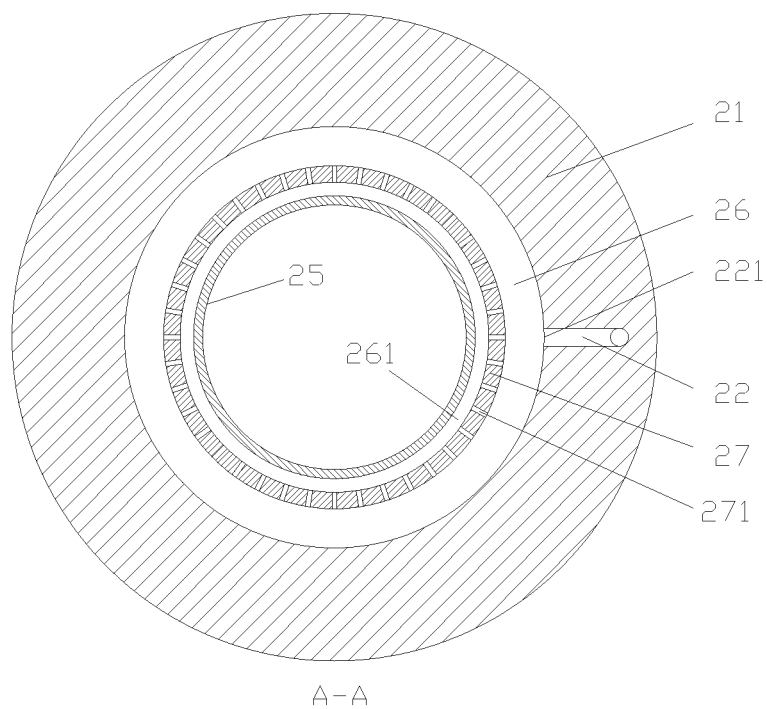
FIG. 3C is a cross-sectional view taken along a line A-A in FIG. 3A according to the first embodiment of the invention.

The way of introducing gas into the reaction compartment 210 according to various embodiments will be described in detail below. Specifically, FIG. 3B is an enlarged view of an area I in FIG. 3A. FIG. 3C is a cross-sectional view taken along line A-A in FIG. 3A. Referring to FIGS. 3B and 3C, a lining ring assembly is provided in the reaction compartment 210, the lining ring assembly is configured such that a flow uniformizing cavity is formed between the lining ring assembly itself and an inner side wall of the reaction compartment 210 and used for uniformly transporting the processing gas, from the gas introducing system, into the reaction compartment 210.

According to at least one embodiment, the specific structure of the lining ring assembly is as follows. The lining ring assembly includes an upper ring body 25 and a lower ring body 24, the upper ring body 25 is positioned at an inner side of the lower ring body 24 with a ring-shaped gap 261 radially interposed therebetween, and the ring-shaped gap 261 is connected to the interior of the reaction compartment 210. An upper ring-shaped horizontal part 251 is provided on an outer side wall of the upper ring body 25, a lower ring-shaped horizontal part 241 is provided on an outer side wall of the lower ring body 24, and a ring-shaped vertical part 27 is provided therebetween, and the flow uniformizing cavity 26 is formed by the upper ring-shaped horizontal part 251, the lower ring-shaped horizontal part 241, the ring-shaped vertical part 27 and the inner side wall of the reaction compartment 210. In addition, a plurality of radial through holes 271 are distributed uniformly in the ring-shaped vertical part 27, and are connected to the flow uniformizing cavity 26 and the ring-shaped gap 261, respectively.

According to at least one embodiment, a gas inlet channel 22 is formed in the side wall of the reaction compartment 210, and has a gas inlet 222 connected to the gas introducing system through a connector 23, and a gas outlet 221 provided at the inner side wall of the reaction compartment 210 and connected to the flow uniformizing cavity 26. When the reaction compartment 210 operates, the processing gas from the gas introducing system flows into the flow uniformizing cavity 26 through the gas inlet channel 22, and diffuses all around until it fills the whole flow uniformizing cavity 26; then the processing gas flows uniformly into the ring-shaped gap 261 through the radial through holes 271, and finally flows into the reaction compartment 210 along the ring-shaped gap 261. Preferably, the gas inlet 222 of the gas inlet channel is positioned at the top of the reaction compartment 210, which can not only reduce space occupied by the periphery of the process chamber, and but also facilitate the connection with the gas introducing system.

It can be seen from the above that, according to at least one embodiment, the flow uniformizing cavity 26 is formed by the upper ring-shaped horizontal part 251, the lower ring-shaped horizontal part 241 and the ring-shaped vertical part 27 of the lining ring assembly, and the inner side wall of the reaction compartment 210; and the processing gas from the gas introducing system is transported uniformly into the reaction compartment 210. In this way, the processing gas can flow into the reaction compartment directly through the flow uniformizing cavity 26, which not only increases the speed at which the processing gas flows into the reaction compartment 210, but also eliminates such a problem that not all the processing gas outputted from the gas introducing system can flow into the reaction compartment, so a flow of the processing gas involved in the process can be controlled more accurately, which is conducive to the processing results. In addition, since the lining ring assembly adopted in the present embodiment is used to form the flow uniformizing cavity 26 between the lining ring assembly and the inner side wall of the reaction compartment 210, the process chamber provided by an embodiment of the invention needs no additional flow uniformizing device provided outside the reaction compartment, and thus there is no need to modify the conventional structure of the chamber and the structure of the chamber can be simplified, thereby reducing the cost of manufacturing the process chamber. In addition, with the flow uniformizing cavity 26, the processing gas can be transited and buffered, and then transported into the reaction compartment uniformly through the radial through holes 271, thereby improving the uniformity of distribution of the processing gas within the reaction compartment and further improving the uniformity of the process.

As illustrated in FIG. 3A, a ring-shaped side wall formed by the lower ring body 24 and the upper ring body 25 can cover the entire surface of the side wall of the reaction compartment 210, so as to protect the side wall of the reaction compartment 210 and prevent it from being attached with contaminate particles. Specifically, the upper end of the upper ring body 25 should not be lower than the top end of the inner side wall of the ring-shaped chamber 21, and the lower end of the upper ring body 25 should be lower than the upper end of the lower ring body 24, so as to cover the entire surface of the side wall of the reaction compartment 210. In addition, in order to ensure that the processing gas, which flows out through the radial through holes 271, can flow into the ring-shaped gap 261, the upper end of the upper ring body 25 is higher than the through holes 271, and the upper end of the lower ring body 24 is lower than the radial through holes 271. In addition, it is preferable that the lower ring body 24 and the upper ring body 25 are connected detachably with the reaction compartment 210 for convenience of cleaning.

Figure 3D:
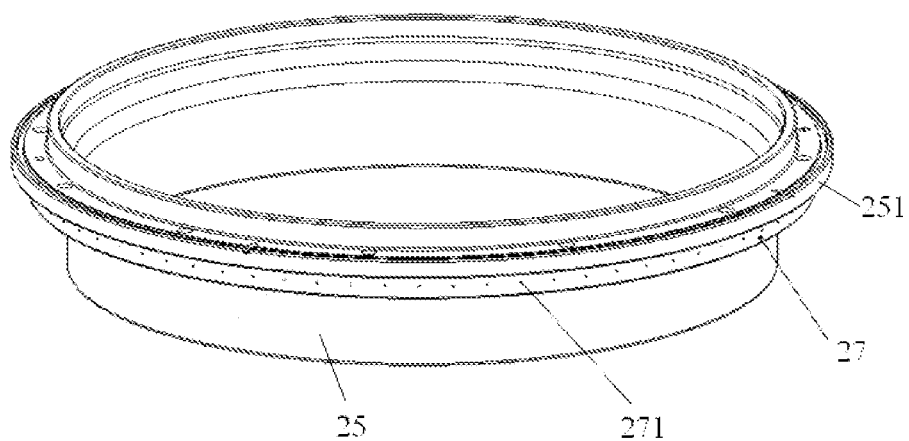
FIG. 3D is a perspective view of an upper lining ring of the process chamber in FIG. 3A according to the first embodiment of the invention.

According to at least one embodiment, the lower ring body 24 and the lower ring-shaped horizontal part 241 are formed integrally, that is, the two have an integrated structure; the upper ring body 25, the upper ring-shaped horizontal part 251 and the ring-shaped vertical part 27 are formed integrally, that is, the three have an integrated structure, as illustrated in FIG. 3D. Therefore, when assembling the lining ring assembly, it only needs to fix the ring-shaped vertical part 27 onto the lower ring-shaped horizontal part 241 to realize the assembling of the upper ring body 25 and the lower ring body 24, and thus integrally manufacturing the particular structure of the upper ring body 25 and the lower ring body 24, which is used for forming the flow uniformizing cavity 26, facilitates the processing and assembling of the lining ring assembly.

It needs to be set forth herein that, in practice, the upper ring body 25 and the upper ring-shaped horizontal part 251 may be manufactured integrally, and the lower ring body 24, the lower ring-shaped horizontal part 241 and the ring-shaped vertical part 27 are manufactured integrally.

Preferably, when determining a diameter of the radial through holes 271, it is better to enable the processing gas to fill the whole flow uniformizing cavity 26 first and then flow out through the radial through holes 271, so that the processing gas can flow uniformly into the reaction compartment 210 from all around. To this end, a diameter of the radial through holes 271 may be designed in a range of 0.5 mm to 2 mm.

According to at least one embodiment, a flange is formed at a lower part of the inner side wall of the reaction compartment 210, and the lower ring body 24 is lapped over the flange through the lower ring-shaped horizontal part 241. The upper end of the ring-shaped vertical part 27 is connected with the upper ring-shaped horizontal part 251, the lower end of the ring-shaped vertical part 27 is supported by the lower ring-shaped horizontal part 241, and the upper ring-shaped horizontal part 251, the ring-shaped vertical part 27, the lower ring-shaped horizontal part 241 and the flange on the inner side wall of the reaction compartment 210 are fixedly connected by screws, so as to fix the lining ring assembly in the reaction compartment 210. It is no doubt that, in practice, the lining ring assembly can be fixed by any other means, and the embodiments of the invention have no particular limitation thereto.

Figure 3E:
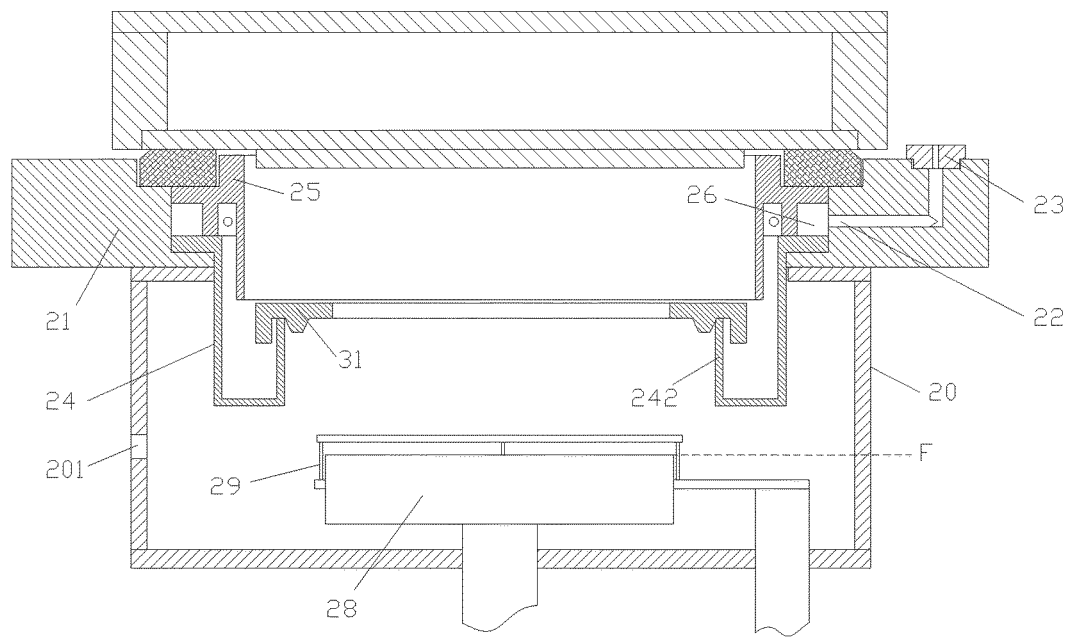
FIG. 3E is a cross-sectional view of the process chamber according to the first embodiment of the invention, in a case of loading and unloading a wafer.

According to at least one embodiment, the wafer transfer device is used for transferring the wafer into the reaction compartment 210. The wafer transfer device includes a lifting pedestal 28 and an ejector pin device 29. The lifting pedestal 28 is provided in the process chamber and positioned under the reaction compartment 210, and moves up and down in a vertical direction by moving vertically in a straight line, and thus can be raised to the processing position E in FIG. 3A and close the reaction compartment 210; or, it falls to the loading and unloading position F under the reaction compartment 210, as illustrated in FIG. 3E, at which an operation of picking/placing a wafer is performed.

According to at least one embodiment, a pressing ring 31 is further provided in the reaction compartment 210, and is used for fixing, with the help of its own weight, the wafer onto the lifting pedestal 28 when the lifting pedestal 28 is raised to the processing position E. At this time, the lifting pedestal 28 and the pressing ring 31 jointly close the opening at the bottom of the reaction compartment 210, so that the reaction compartment 210 is isolated from the space thereunder to form a relatively independent processing environment. In addition, when the lifting pedestal 28 falls down and moves out of the reaction compartment 210, the pressing ring 31 is supported by the lower ring body 24. Specifically, a curved part 242 for supporting the pressing ring 31 is provided at a lower end of the lower ring body 24. When the lifting pedestal 28 is at the processing position E, a top end of the curved part 242 is lower than the supported part of the bottom of the pressing ring 31, and when the lifting pedestal 28 moves out of the reaction compartment 210, the pressing ring 31 falls down to the top end of the curved part 242 automatically.

According to at least one embodiment, a wafer transfer channel 201 is provided on a side wall of the process chamber and used for moving the wafer into or out of the process chamber. The ejector pin device 29 is used to cooperate with the mechanical arm outside the process chamber to move the wafer into the process chamber and deliver the wafer onto the lifting pedestal 28, or to move the wafer out of the process chamber from the lifting pedestal 28. Specifically, the ejector pin device 29 includes at least three ejector pins, and moves up and down in a vertical direction by moving vertically in a straight line, so as to realize the loading and unloading of the wafer. In a case that an unprocessed wafer is loaded, after the lifting pedestal 28 descends to the preset loading position F, the at least three ejector pins are raised vertically until the top end thereof becomes higher than the upper surface of the lifting pedestal 28. At this time, the wafer is delivered, by the mechanical arm outside the process chamber, into the process chamber through the wafer transfer channel 201, and is placed on the at least three ejector pins. The ejector pins, which are carrying the wafer, descend vertically until the top end thereof is lower than the upper surface of the lifting pedestal 28, and at this time, the wafer is transferred onto the upper surface of the lifting pedestal 28. Then the lifting pedestal 28 is raised to the processing position E to complete the loading of the wafer.

It needs to be set forth herein that, in practice, the ejector pin device can be omitted in the wafer transfer device, and the wafer is transferred between the wafer transfer device and the process chamber only by the cooperation of the lifting pedestal and the mechanical arm outside the process chamber.

It needs to be further set forth herein that, the structure of the lining ring assembly for forming the flow uniformizing cavity is not limited to the structure used in an embodiment, and in practice, the lining ring assembly may also be designed to have other specific structure, so as to form the flow uniformizing cavity between the lining ring assembly and the inner side wall of the reaction compartment.

The process chamber according to a second embodiment of the invention includes a plurality of reaction compartments, a plurality of gas introducing systems independent from each other, and a wafer transfer device. The plurality of reaction compartments are provided in the process chamber and distributed uniformly along a circumferential direction of the process chamber, each reaction compartment forms a separate processing environment therein, and the plurality of gas introducing systems (not shown in the drawings) are used to transport processing gases into the reaction compartments in one to one correspondence. Since each reaction compartment forms a separate processing environment, the gas introducing systems transport the processing gases into the reaction compartments in one to one correspondence, and the wafers are transferred into the reaction compartments by the wafer transfer device, two or more processes can be performed simultaneously by using at least two reaction compartments in a single process chamber without increasing the number of process chambers. Thus, on the premise of not changing the number of process chambers, the number of processes performed simultaneously can be increased by only increasing the number of reaction compartments, and there is no need to redesign the structure of the transfer cavity, thereby reducing the cost of manufacturing the apparatus. In addition, since the at least two reaction compartments are distributed uniformly along the circumferential direction of the process chamber, the overall structure of the process chamber may be more compact and occupy less space, compared to the conventional art.

Furthermore, the lining ring assembly is provided in each reaction compartment, and the structure and function of the lining ring assembly is completely the same as that of the lining ring assembly in a single reaction compartment according to the above first embodiment. By using the upper ring-shaped horizontal part, the lower ring-shaped horizontal part and the ring-shaped vertical part of the lining ring assembly, a flow uniformizing cavity is formed between the lining ring assembly and the inner side wall of the reaction compartment, and thus the processing gas from the gas introducing system is transported into the reaction compartment uniformly. Therefore, for each reaction compartment, processing gas, from the gas introducing system corresponding to the reaction compartment, can be directly transported into the reaction compartment through the flow uniformizing cavity, thereby not only increasing the speed at which the processing gas flows into the reaction compartment, but also eliminating such a problem that not all the progressing gas outputted from the gas introducing system can flow into the reaction compartment, so a flow of the processing gas involved in the process can be controlled more accurately, which is conducive to the processing results. In addition, with the flow uniformizing cavity, the processing gas can be transited and buffered, thereby improving the uniformity of distribution of the processing gas within the reaction compartment and further improving the uniformity of the process. The detailed description of the structure and function of the lining ring assembly is omitted herein since it has been presented in the above first embodiment.

Figure 4:
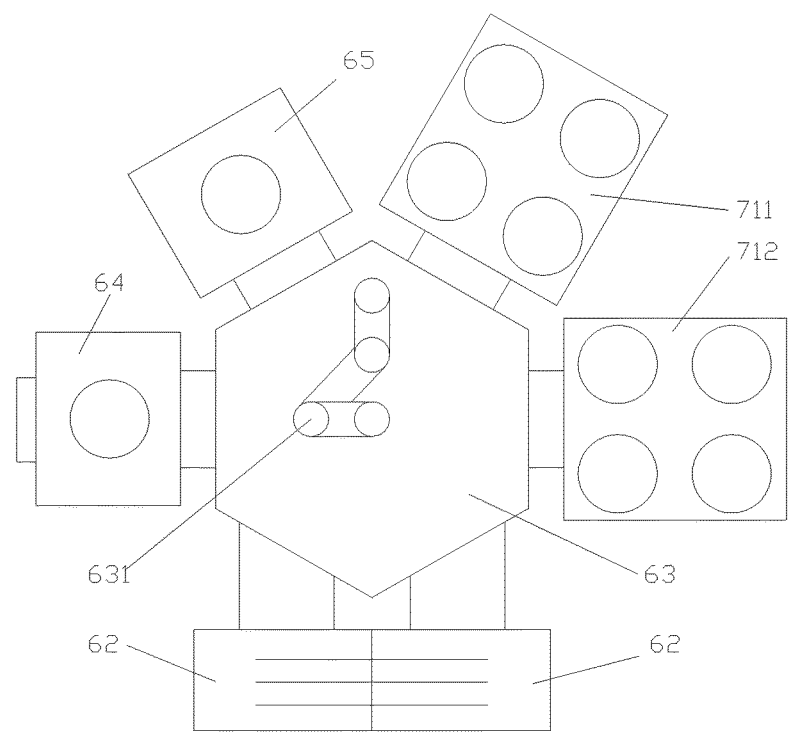
FIG. 4 is a schematic structure diagram of a semiconductor processing apparatus according to another embodiment of the invention.

As another technical solution, embodiments of the invention also provide a semiconductor processing apparatus, and FIG. 4 is a schematic structure diagram of a semiconductor processing apparatus according to such embodiment of the invention. Referring to FIG. 4, the semiconductor processing apparatus includes: two process chambers (711 and 712) for performing a process on a wafer, each process chamber being the process chamber according to the above first or second embodiment; a degas chamber 64 for removing the water vapor from the wafer; a precleaning chamber 65 for removing remnant on a surface of the wafer; a transfer cavity 63, which is connected to the two process chambers (711 and 712), the degas chamber 64 and the precleaning chamber 65, respectively, and is provided with a mechanical arm 631 therein for transferring the wafer into the chambers, respectively; and two loading platform 62, which are used for carrying unprocessed and processed wafers, respectively.

It needs to be set forth herein that, according to the present embodiment, the number of process chambers is two, but other embodiments of the invention are not limited thereto. In practice, the number of process chambers may be one, or three or more, depending on the specific requirements.

In practice, the semiconductor processing apparatus may include a PVD apparatus.

Embodiments of the invention provide non-obvious advantages over the conventional art. The process chamber provided by various embodiments of the invention include the lining ring assembly arranged in the reaction compartment, and a flow uniformizing cavity is formed between the lining ring assembly and the inner side wall of the reaction compartment, and is used for transporting the processing gas from the gas introducing system into the reaction compartment, so that the processing gas can flow into the reaction compartment directly through the flow uniformizing cavity, thereby not only increasing the speed of the processing gas flowing into the reaction compartment, but also eliminating such a problem that not all the processing gas outputted from the gas introducing system can flow into the reaction compartment. Therefore, a flow of the processing gas involved in the process can be controlled more accurately, which is conducive to the processing results. In the meantime, the process chamber provided by the present invention needs no additional flow uniformizing device provided outside the reaction compartment, and thus there is no need to modify the conventional structure of the chamber and the structure of the chamber can be simplified, thereby reducing the cost of manufacturing the process chamber. In addition, with the flow uniformizing cavity, the processing gas from the gas introducing system can be transported into the reaction compartment uniformly, thereby improving the uniformity of distribution of the processing gas within the reaction compartment and further improving the uniformity of the process.

Additionally, the semiconductor processing apparatus provided by various embodiments of the invention employs the process chamber according to the above embodiments of the invention, and thus can improve the speed at which the processing gas flows into the reaction compartment, the accuracy of controlling the flow of the processing gas involved in the process, and the uniformity of distribution of the processing gas within the reaction compartment, thereby not only improving the processing efficiency and the processing results, but also improving the uniformity of the process.

Terms used herein are provided to explain embodiments, not limiting the invention. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

Embodiments of the invention may suitably comprise, consist or consist essentially of the elements disclosed and may be practiced in the absence of an element not disclosed. According to at least one embodiment, it can be recognized by those skilled in the art that certain steps can be combined into a single step.

The terms and words used in the specification and claims should not be interpreted as being limited to typical meanings or dictionary definitions, but should be interpreted as having meanings and concepts relevant to the technical scope of the invention based on the rule according to which an inventor can appropriately define the concept of the term to describe the best method he or she knows for carrying out the invention.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The singular forms "a," "an," and "the" include plural referents, unless the context clearly dictates otherwise.

As used herein and in the appended claims, the words "comprise," "has," and "include" and all grammatical variations thereof are each intended to have an open, non-limiting meaning that does not exclude additional elements or steps.

As used herein, it will be understood that unless a term such as 'directly' is not used in a connection, coupling, or disposition relationship between one component and another component, one component may be 'directly connected to', 'directly coupled to' or 'directly disposed to' another element or be connected to, coupled to, or disposed to another element, having the other element intervening therebetween.

As used herein, the terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "according to an embodiment" herein do not necessarily all refer to the same embodiment.

It can be understood that the foregoing implementations are merely exemplary implementations used for describing the principle of embodiments of the invention, but the present invention is not limited thereto. Those of ordinary skill in the art may make various variations and improvements without departing from the spirit and essence of the present invention, and these variations and improvements shall fall into the protection scope of the embodiments of the invention.

The invention claimed is:

1. A process chamber, comprising:
    a reaction compartment;
    a gas introducing system;
    and a wafer transfer device,
    wherein the reaction compartment is provided in the process chamber and used for performing a process on a wafer therein,
    wherein the gas introducing system is used for providing processing gas to the reaction compartment,
    wherein the wafer transfer device is used for transferring the wafer into the reaction compartment,
    wherein a lining ring assembly is provided in the reaction compartment, and is configured such that a flow uniformizing cavity is formed between the lining ring assembly itself and an inner side wall of the reaction compartment, so as to uniformly transport the processing gas, from the gas introducing system, into the reaction compartment through the flow uniformizing cavity, and
    wherein the lining ring assembly comprises an upper ring body and a lower ring body, the upper ring body being positioned at an inner side of the lower ring body; an upper ring-shaped horizontal part is provided on an outer side wall of the upper ring body, a lower ring-shaped horizontal part is provided on an outer side wall of the lower ring body, a ring-shaped vertical part is provided between the upper ring-shaped horizontal part and the lower ring-shaped horizontal part, and the flow uniformizing cavity is formed by the upper ring-shaped horizontal part, the lower ring-shaped horizontal part, the ring-shaped vertical part and the inner side wall of the reaction compartment.

2. The process chamber according to claim 1, wherein the upper ring body and the lower ring body are provided with a ring-shaped gap interposed therebetween, and the ring-shaped gap is connected to an interior of the reaction compartment, and
    wherein a plurality of radial through holes are distributed uniformly in the ring-shaped vertical part, and are connected to the flow uniformizing cavity and the ring-shaped gap, respectively.

3. The process chamber according to claim 1 or 2, wherein the process chamber comprises one reaction compartment.

4. The process chamber according to claim 1 or 2, wherein the process chamber comprises at least two reaction compartments, which are distributed uniformly along a circumferential direction of the process chamber, and each reaction compartment forms an independent processing environment therein, and
    wherein a number of the gas introducing systems corresponds to that of the reaction compartments, and each of the gas introducing systems transports processing gases into a reaction compartment in a one to one correspondence.

5. The process chamber according to claim 1 or 2, wherein a gas inlet channel is formed in a side wall of the reaction compartment, and has a gas inlet connected to the gas introducing system, and a gas outlet provided at the inner side wall of the reaction compartment and connected to the flow uniformizing cavity.

6. The process chamber according to claim 5, wherein the gas inlet of the gas inlet channel is positioned at top of the reaction compartment.

7. The process chamber according to claim 2, wherein the radial through hole has a diameter ranging from 0.5 mm to 2 mm.

8. The process chamber according to claim 2, wherein the upper ring body, the upper ring-shaped horizontal part and the ring-shaped vertical part are formed integrally, and the lower ring body and the lower ring-shaped horizontal part are formed integrally; or, the upper ring body and the upper ring-shaped horizontal part are formed integrally, and the lower ring body, the lower ring-shaped horizontal part and the ring-shaped vertical part are formed integrally.

9. A semiconductor processing apparatus, comprising:
a process chamber for performing a process on a wafer therein;
a degas chamber for removing water vapor from the wafer;
a precleaning chamber for removing remnant on a surface of the wafer; and
a transfer cavity, which is connected to the process chamber, the degas chamber and the precleaning chamber, respectively, and is provided therein with a mechanical arm which is used for transferring the wafer into the chambers, respectively,
wherein the process chamber is the process chamber according to any one of claims 1 or 2.

10. The semiconductor processing apparatus according to claim 9, wherein the semiconductor processing apparatus includes a plurality of process chambers.

\* \* \* \* \*